United States Patent
Lin et al.

(10) Patent No.: US 10,498,310 B2
(45) Date of Patent: Dec. 3, 2019

(54) PROTECTIVE COVER FOR AN ACOUSTIC WAVE DEVICE AND FABRICATION METHOD THEREOF

(71) Applicant: WIN Semiconductors Corp., Tao Yuan (TW)

(72) Inventors: Cheng-Kuo Lin, Tao Yuan (TW);
Shu-Hsiao Tsai, Tao Yuan (TW);
Rong-Hao Syu, Tao Yuan (TW);
Yi-Ling Liu, Tao Yuan (TW);
Re-Ching Lin, Tao Yuan (TW);
Pei-Chun Liao, Tao Yuan (TW)

(73) Assignee: WIN SEMICONDUCTORS CORP., Taoyuan (TW)

(*) Notice: Subject to any disclaimer, the term of this patent is extended or adjusted under 35 U.S.C. 154(b) by 365 days.

(21) Appl. No.: 15/070,383

(22) Filed: Mar. 15, 2016

(65) Prior Publication Data
US 2017/0077899 A1 Mar. 16, 2017

(30) Foreign Application Priority Data

Sep. 10, 2015 (TW) .............................. 104129984 A

(51) Int. Cl.
*H03H 9/10* (2006.01)

(52) U.S. Cl.
CPC ........ *H03H 9/1071* (2013.01); *H03H 9/1014* (2013.01)

(58) Field of Classification Search
CPC ......................... H03H 9/1071; H03H 9/1014
See application file for complete search history.

*Primary Examiner* — Seahvosh Nikmanesh
(74) *Attorney, Agent, or Firm* — Muncy, Geissler, Olds & Lowe, P.C.

(57) ABSTRACT

A protective cover for an acoustic wave device and a fabrication method thereof, for protecting an acoustic wave device having a resonant area during a packaging operation so as to avoid molding compound flowing onto the resonant area of the acoustic wave device. The fabrication method comprises: defining a sacrificial area on the acoustic wave device; forming a sacrificial layer on the sacrificial area; covering a metal covering layer on the sacrificial layer and connecting a bottom rim of the metal covering layer to the acoustic wave device and forming an opening between the bottom rim of the metal covering layer and the acoustic wave device; and removing the sacrificial layer to form a cavity between the metal covering layer and the resonant area by using a chemical solution, wherein the chemical solution enters from the opening between the metal covering layer and the acoustic wave device.

10 Claims, 7 Drawing Sheets

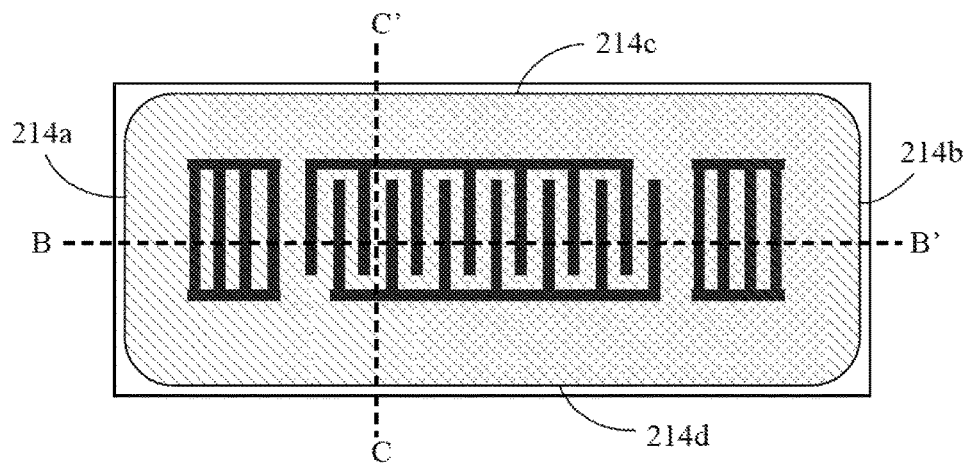
FIG. 2A
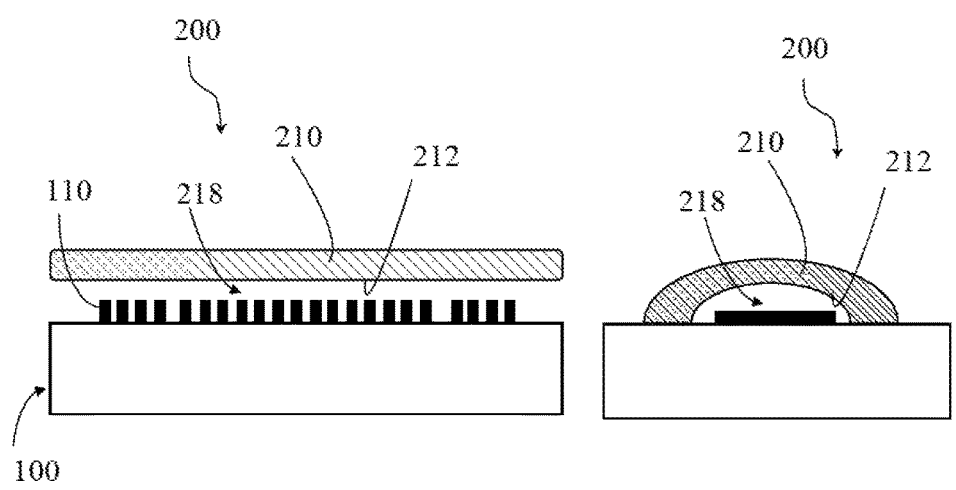
FIG. 2B
FIG. 2C

PROTECTIVE COVER FOR AN ACOUSTIC WAVE DEVICE AND FABRICATION METHOD THEREOF

FIELD OF THE INVENTION

The present invention relates to a protective cover for an acoustic wave device and a fabrication method thereof, and more particular to a method for forming a protective cover for an acoustic wave device used in a communication system and a fabrication method thereof.

BACKGROUND OF THE INVENTION

The band pass filter in a communication system is comprised of various acoustic wave devices, including surface acoustic wave filter and bulk acoustic wave filter. Acoustic wave devices are very sensitive to the mass loading. Even a very small mass loading may change the frequency response of the device. It is known that an 8 nm-thick titanium mass loading layer can lower the resonance frequency of a film bulk acoustic wave resonator (FBAR) by 10 MHz, and the return loss is reduced accordingly. This is owing to the mass loading on the surface of the device changes the boundary condition of the acoustic wave resonance, which leads to a change of the frequency response characteristic of the device. Therefore, it should be avoided to coat any material on the surface of the device during the fabrication and packaging processes. According to the results of product analysis, a cavity on the acoustic wave resonance or transmission area is requested for both surface and bulk acoustic wave devices to avoid the surface mass loading effect described above.

Currently, the surface acoustic wave filters used in mobile communication systems are mostly bonded to the surface of the packaging substrate by using the ultrasonic flip chip bonding technology. The space between the chip and the packaging substrate is about 10 μm, which can avoid molding compound flowing onto the surface of the surface acoustic wave device during the molding process. However, it is required to use the high price gold bump in the ultrasonic flip chip bonding technology, and the fabrication rate is low.

In order to reduce the deficiency of the fabrication process using the ultrasonic flip chip bonding technology, some of the product are bonded by using copper pillar reflow flip chip bonding technology. However, the space between the chip and the packaging substrate is determined by the height of the copper pillars, which is usually higher than 20 μm. In this case, the molding compound can flow onto the surface of the surface acoustic wave device more easily during the packaging process and change the frequency response of the device.

SUMMARY OF THE INVENTION

Accordingly, in order to avoid the foregoing problem of molding compound intrusion during a packaging operation, the present invention provides an acoustic wave device protection structure and a formation method thereof, which forms a protection structure over the resonant area of the acoustic wave device, so that the molding compound flowing onto the resonant area of the acoustic wave device and subsequently effecting the frequency response characteristic can be avoided. Moreover, in order to reduce the process steps and improve the process yield, the process steps of forming the acoustic wave device protection structure provided by the present invention is simple, and the protection structure thus formed is stable and not easy to collapse and it can be applied in the packaging process using a flip chip bonding technology or a wire bonding technology.

To reach the objects stated above, the present invention provides an acoustic wave device protection structure for protecting an acoustic wave device having a resonant area during a packaging operation so as to avoid molding compound flowing onto the resonant area of the acoustic wave device. The acoustic wave device protection structure comprises: a metal covering layer, having a concave surface and a bottom rim, the bottom rim connected to the acoustic wave device and forming at least one opening between the bottom rim and the acoustic wave device, and the concave surface covering over the resonant area to form a cavity between the concave surface and the resonant area.

Moreover, the present invention provides a method for forming the foregoing acoustic wave device protection structure, which comprises steps of:

defining a sacrificial area on the acoustic wave device;

forming a sacrificial layer on the sacrificial area;

covering a metal covering layer on the sacrificial layer by electroplating method, connecting a bottom rim of the metal covering layer to the acoustic wave device and forming an opening between the bottom rim of the metal covering layer and the acoustic wave device; and removing the sacrificial layer to form a cavity between the metal covering layer and the resonant area by using a chemical solution, wherein the chemical solution enters from the opening between the metal covering layer and the acoustic wave device.

In implementation, the acoustic wave device protection structure further comprises a protective layer formed on the metal covering layer and covering the bottom rim and the opening between the bottom rim and the acoustic wave device.

In implementation, the metal covering layer is made of a metallic material containing Cu, W, Al, or Au.

In implementation, the acoustic wave device comprises a bulk acoustic wave device or a surface acoustic wave device.

In implementation, the bottom rim of the metal covering layer is formed in a polygonal shape, and at least two sides of the bottom rim form openings between the bottom rim and the acoustic wave device.

In implementation, the bottom rim of the metal covering layer has at least two opposite sides, and the at least two opposite sides form openings between the bottom rim and the acoustic wave device.

In implementation, the sacrificial layer is made of polymer, ceramic material, or metallic material.

The present invention will be understood more fully by reference to the detailed description of the drawings and the preferred embodiments below.

BRIEF DESCRIPTION OF DRAWINGS

FIG. 2A is a top view of an embodiment of an acoustic wave device protection structure provided by the present invention, and FIGS. 2B and 2C are cross-sectional views respectively along lines BB' and CC' shown in FIG. 2A.

DETAILED DESCRIPTIONS OF PREFERRED EMBODIMENTS

Figure 1:
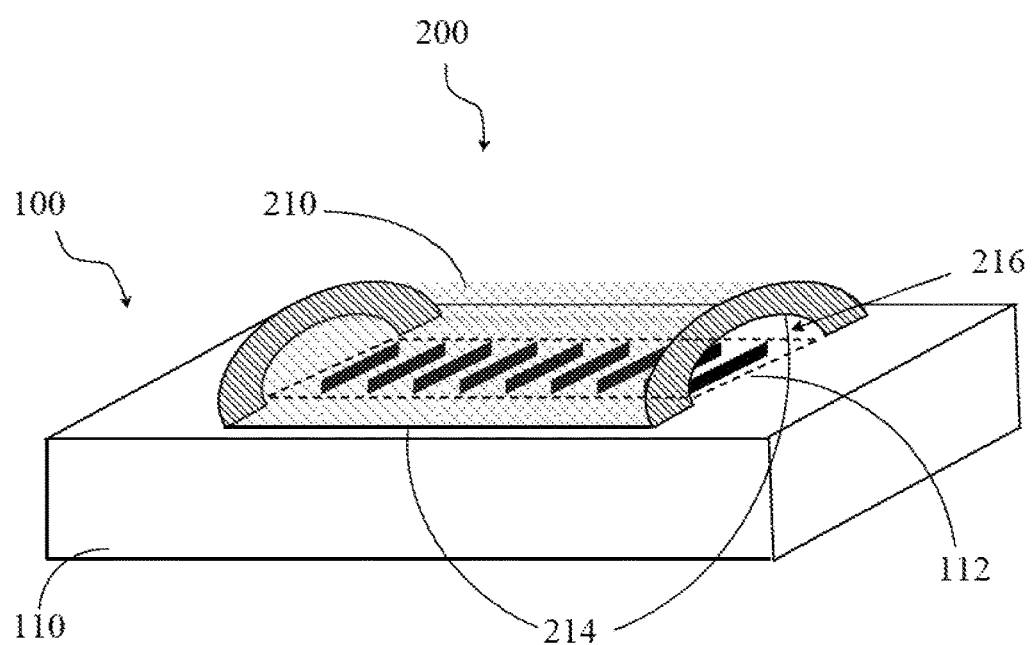
FIG. 1 is perspective view of an embodiment of an acoustic wave device protection structure provided by the present invention.

FIGS. 1A and 2A-2C show an embodiment of an acoustic wave device protection structure provided by the present invention. As shown in the figures, an acoustic wave device 100 comprises a substrate 110 and an interdigital transducer (IDT) on the substrate 110. The area on the substrate containing the IDT is defined as a resonant area 112. An acoustic wave device protection structure 200 is formed on the acoustic wave device 100 and comprises a metal covering layer 210. The metal covering layer 210 has a concave surface 212 and a bottom rim 214. The bottom rim 214 is connected to the substrate 110 of the acoustic wave device 100 and forms at least one opening 216 between the bottom rim 214 and the acoustic wave device 100. The concave surface 212 covers over the resonant area 112 to form a cavity 218 between the concave surface 212 and the resonant area 112. The formed acoustic wave device protection structure 200 is for protecting the acoustic wave device 100, so as to avoid molding compound flowing onto the resonant area 112 of the acoustic wave device 100 during a packaging operation.

Figure 3A:
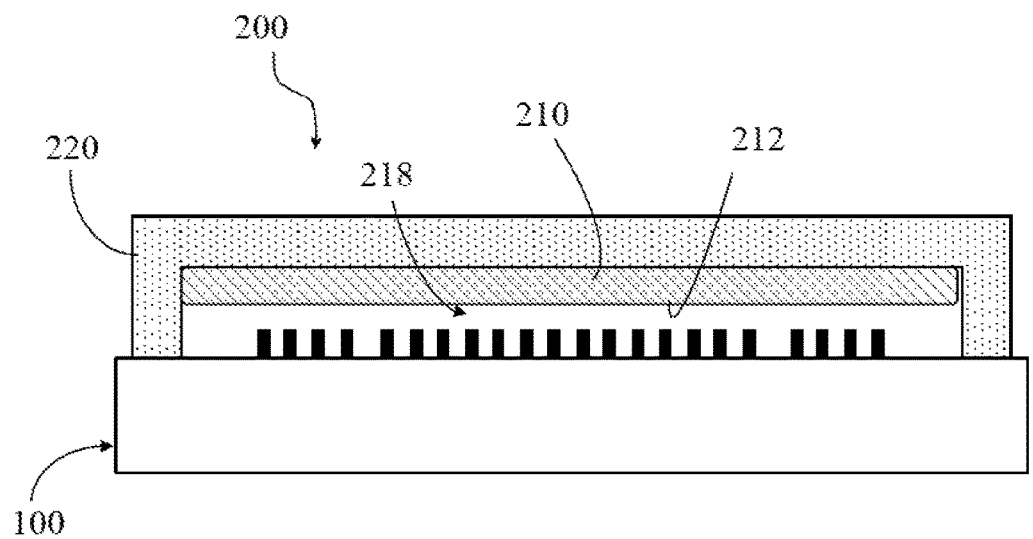
FIGS. 3A and 3B are cross-sectional views of another embodiment of a method for forming a through wafer via hole in a semiconductor device provided by the present invention.
Figure 3B:
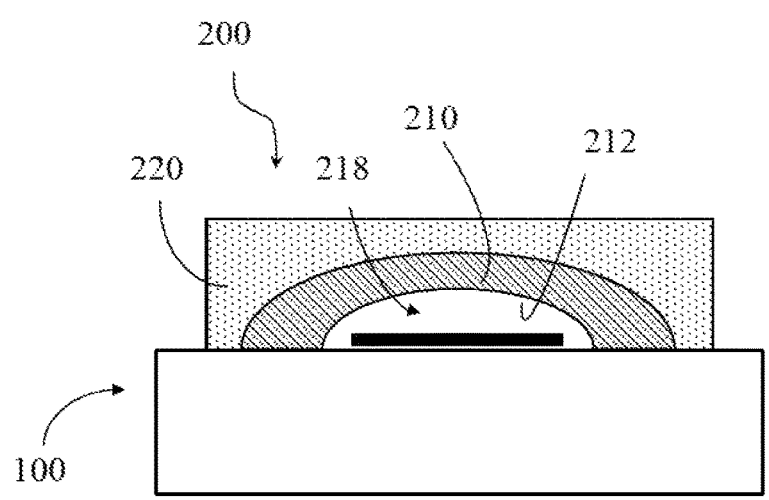

In another embodiment, the acoustic wave device protection structure 200 may further comprises a protective layer 220, as shown in FIGS. 3A and 3B. The protective layer 220 is formed on the metal covering layer 210 and covers the bottom rim 214 and the opening 216 between the bottom rim 214 and the acoustic wave device 100, so as to further reduce the probability that the molding compound flowing onto the surface of the device.

Figure 4:
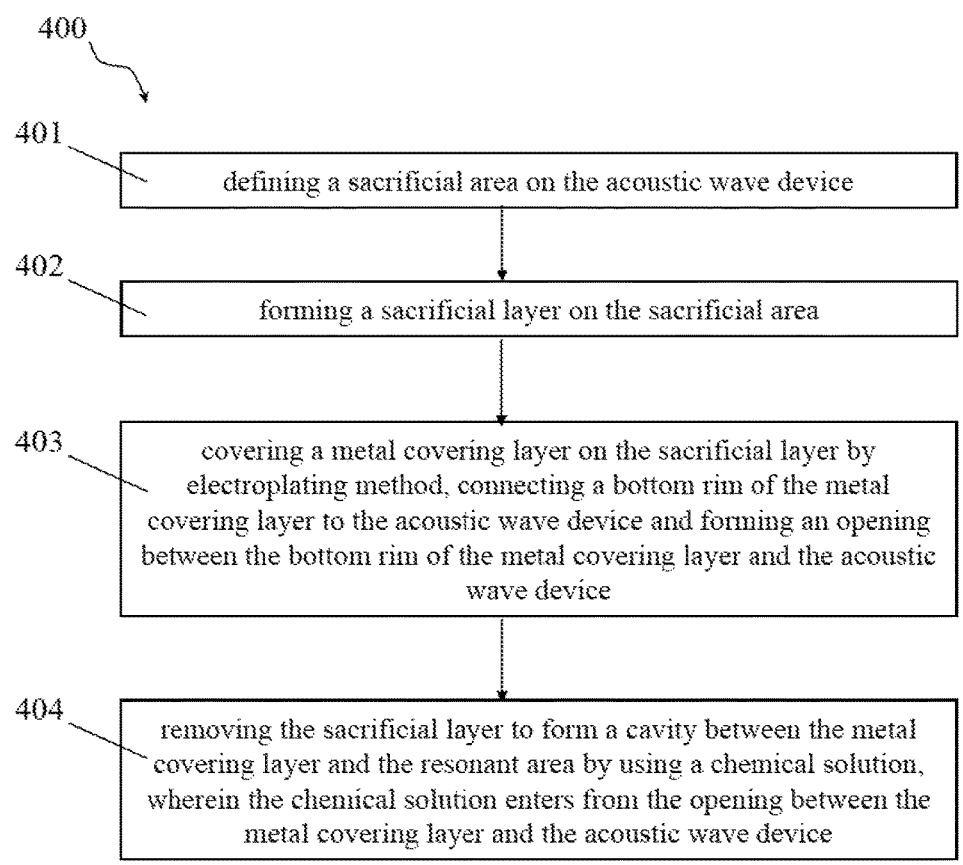
FIG. 4 is a flow chart of an embodiment of a method for forming an acoustic wave device protection structure provided by the present invention.
Figure 5A:
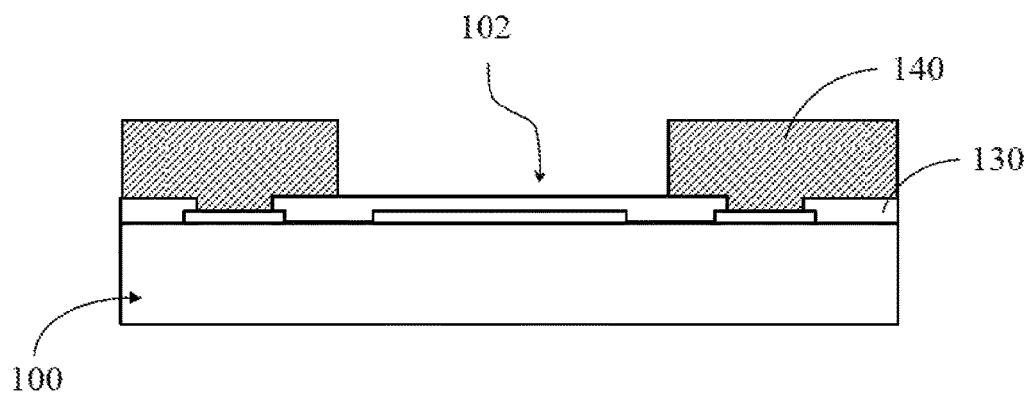
FIGS. 5A-5E are schematic views of another embodiment of the method for forming an acoustic wave device protection structure provided by the present invention.
Figure 5B:
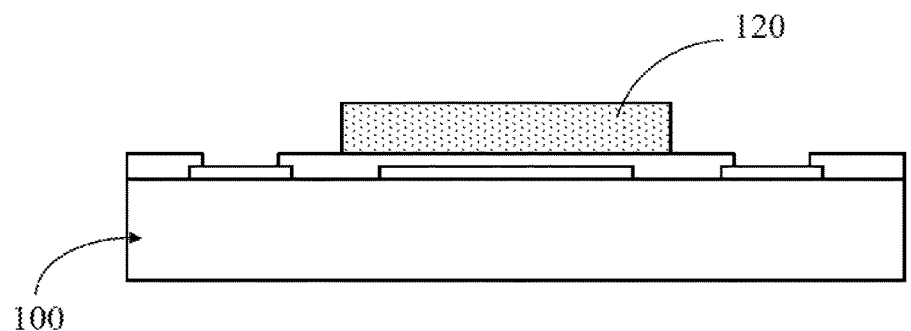
Figure 5C:
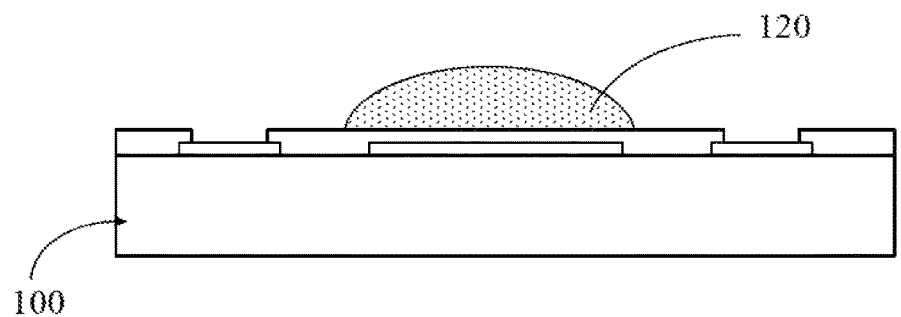
Figure 5D:
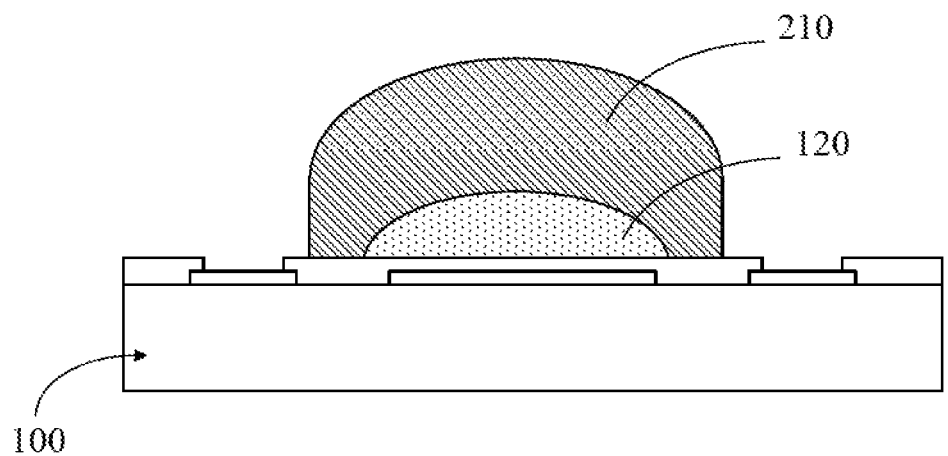
Figure 5E:
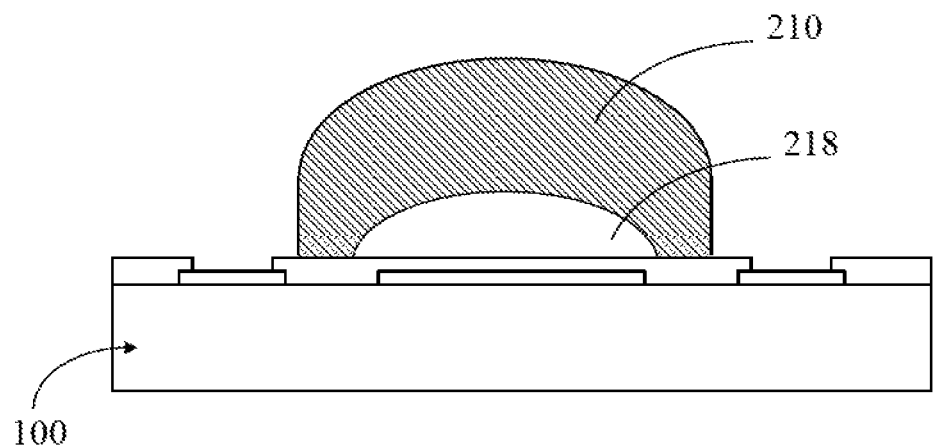

Moreover, the present invention provides a method 400 for forming the acoustic wave device protection structure 200. FIG. 4 is a flow chart of an embodiment of the method 400, which comprises steps of: in step 401, defining a sacrificial area 102 on the acoustic wave device 100; in step 402, forming a sacrificial layer 120 on the sacrificial area 102; in step 403, covering a metal covering layer 210 on the sacrificial layer 120 by electroplating method, connecting a bottom rim 214 of the metal covering layer 210 to the acoustic wave device 100 and forming an opening 216 between the bottom rim 214 of the metal covering layer 210 and the acoustic wave device 100; and in step 404, removing the sacrificial layer 120 to form a cavity 218 between the metal covering layer 210 and the resonant area 112 by using a chemical solution, wherein the chemical solution enters from the opening 216 between the metal covering layer 210 and the acoustic wave device 100.

FIGS. 5A to 5E show an embodiment of an embodiment of the method 400 for forming an acoustic wave device protection structure. First, a $SiN_x$ or $SiO_2$ layer is deposited on the acoustic wave device 100 as a device protection layer 130. Then, the sacrificial area 102 is defined on the resonant area 112 of the acoustic wave device by a mask 140 and forming the sacrificial layer 120 on the sacrificial area 102. The mask 140 is then removed and the substrate 110 is heated to make the surface of the sacrificial layer 120 in an arc shape for the subsequent bridging. A metal covering layer 210 is then electroplated on the sacrificial layer 120 to bridge the two sides of the resonant area and forms the opening 216. The size and shape of the opening 216 is controlled by the mask pattern. Finally, the chemical solution enters from the opening 216 between the metal covering layer 210 and the substrate 110 to remove the sacrificial layer 120, such that the cavity 218 is formed above the resonant area of the acoustic wave device.

In an embodiment, the sacrificial layer 120 is made preferably of polymer, ceramic material, or metallic material.

Figure 6:
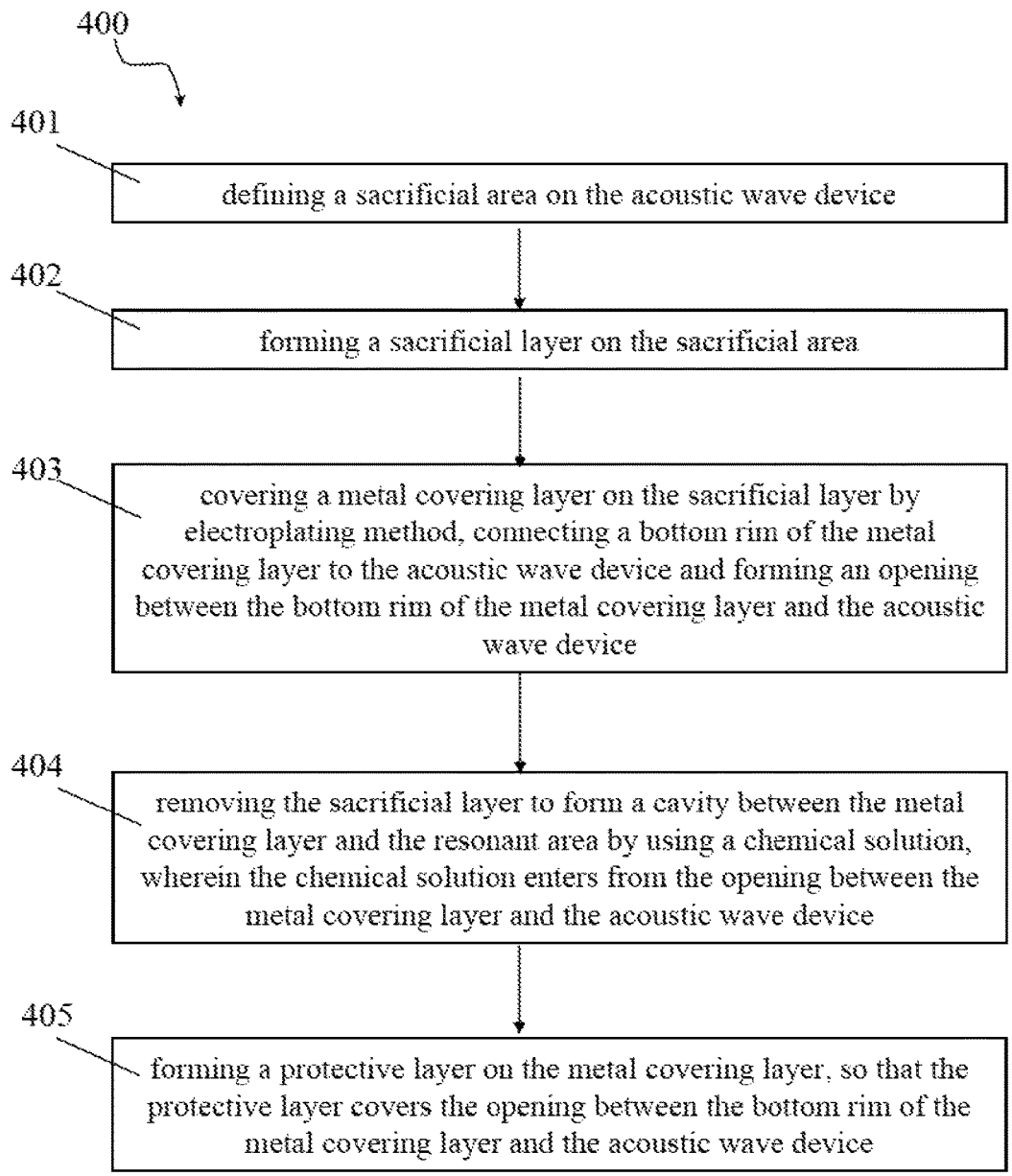
FIG. 6 is a flow chart of another embodiment of the method for forming an acoustic wave device protection structure provided by the present invention.

In an embodiment, the method 400 for forming an acoustic wave device protection structure 200 may further comprise a step 405. As shown in the embodiment of FIG. 6, in step 405, a protective layer 220 is formed on the metal covering layer 210, so that the protective layer 220 covers the opening 216 between the bottom rim 214 of the metal covering layer 210 and the acoustic wave device 100.

In an embodiment, after finishing the foregoing acoustic wave device protection structure, copper pillars may be formed on the electrical connection area of the device for the copper pillar reflow processes in the flip chip bonding of the device.

The acoustic wave device 100 protected by the protection structure provided by the present invention may be a bulk acoustic wave device or a surface acoustic wave device. The substrate 110 of the acoustic wave device 100 is made preferably of piezoelectric material, for example, $LiTaO_3$, $LiNbO_2$, quartz, piezoelectric ceramics, such as Lead zirconate titanate (PZT), and the like.

In an embodiment, the metal covering layer 210 is made preferably of a metallic material containing Cu, W, Al, or Au, in which a metallic material containing Cu is more preferred. The protective layer 220 is made preferably of polymeric materials, such as SU8 photoresist, acrylic, polymers.

The bottom rim 214 of the metal covering layer 210 may be formed in a polygonal shape, such as a rectangle or square, or a non-polygonal shape, such as a circle or oval. In an embodiment, the metal covering layer 210 has a concave surface 212 and a rectangular bottom rim 214. The rectangular bottom rim 214 has two pairs of opposite sides. One pair of opposite sides 214c and 214d are connected to the substrate 110 of the acoustic wave device, and the other pair of opposite sides 214a and 214b respectively form openings 216 between themselves and the substrate 110. A cavity is formed between the concave surface 212 and the resonant area 112, such that the metal covering layer 210 forms a protection bridge structure covering over the resonant area of the acoustic wave device. In one embodiment, the largest width of the opening 216 between the metal covering layer 210 and the substrate 110 is 10 μm, so that flowing of the molding compound onto the resonant area of the acoustic wave device can be avoided.

The present invention has the following advantages:

1. The acoustic wave device protection structure provided by the present invention can cover the resonant area of the acoustic wave device, so as to effectively avoid molding compound flowing onto the resonant area of the acoustic wave device during a packaging operation.

2. The acoustic wave device protection structure provided by the present invention is made of metal. The high hardness of metal can prevent collapse of the acoustic wave device protection structure, and therefore the yield of the packaging operation is improved.

3. In the method for forming an acoustic wave device protection structure provided by the present invention, the protection structure and the opening for removing the sacrificial layer can be formed in one step rather than two steps, and therefore the fabrication process can be simplified.

4. In the acoustic wave device protection structure provided by the present invention, the opening for removing the sacrificial layer are provided on the lateral sides of the protection structure, and the position and size of the opening can be controlled by a mask, so that the molding compound can not flow onto the resonant area of the acoustic wave device easily during a packaging operation. There is no need to cover the opening after removing the sacrificial layer, and therefore the fabrication process can be simplified.

5. The acoustic wave device protection structure provided by the present invention can be applied in a wide variety of applications, like flip chip bonding or wire bonding packaging process.

To sum up, the protective cover for an acoustic wave device and the fabrication method thereof provided by the present invention can indeed meet its anticipated objective to avoid molding compound flowing onto the resonant area of the acoustic wave device during a packaging operation. The process of the fabrication method provided by the present invention is simple. The protective cover produced by the fabrication method is hard and does not collapse easily, and therefore the yield of the packaging operation is improved. Moreover, the protection structure provided by the present invention can be applied in a wide variety of applications, like flip chip bonding or wire bonding packaging process.

The description referred to in the drawings and stated above is only for the preferred embodiments of the present invention. Many equivalent local variations and modifications can still be made by those skilled at the field related with the present invention and do not depart from the spirit of the present invention, so they should be regarded to fall into the scope defined by the appended claims.

What is claimed is:

1. A method for forming an acoustic wave device protection structure, for protecting an acoustic wave device having a resonant area during a packaging operation so as to avoid molding compound flowing onto the resonant area of the acoustic wave device, the method comprising steps of:
    defining a sacrificial area on the acoustic wave device;
    forming a sacrificial layer on the sacrificial area;
    covering a metal covering layer on the sacrificial layer by electroplating method, connecting a bottom rim of the metal covering layer to the acoustic wave device and forming an opening between the bottom rim of the metal covering layer and the acoustic wave device; and
    removing the sacrificial layer to form a cavity between the metal covering layer and the resonant area by using a chemical solution, wherein the chemical solution enters from the opening between the metal covering layer and the acoustic wave device.

2. The method for forming an acoustic wave device protection structure according to claim 1, further comprising forming a protective layer on the metal covering layer, so that the protective layer covers the opening between the bottom rim of the metal covering layer and the acoustic wave device.

3. The method for forming an acoustic wave device protection structure according to claim 2, wherein the protective layer is made of polymer.

4. The method for forming an acoustic wave device protection structure according to claim 1, wherein the metal covering layer is made of a metallic material containing Cu, W, Al, or Au.

5. The method for forming an acoustic wave device protection structure according to claim 1, wherein the acoustic wave device comprises a bulk acoustic wave device or a surface acoustic wave device.

6. The method for forming an acoustic wave device protection structure according to claim 1, wherein the sacrificial layer is made of polymer.

7. The method for forming an acoustic wave device protection structure according to claim 1, wherein the bottom rim of the metal covering layer is formed in a polygonal shape, and at least two sides of the bottom rim form openings between the bottom rim and the acoustic wave device.

8. The method for forming an acoustic wave device protection structure according to claim 7, wherein the bottom rim of the metal covering layer has at least two opposite sides, and the at least two opposite sides form openings between the bottom rim and the acoustic wave device.

9. The method for forming an acoustic wave device protection structure according to claim 1, wherein the sacrificial layer is made of ceramic material.

10. The method for forming an acoustic wave device protection structure according to claim 1, wherein the sacrificial layer is made of metallic material.

* * * * *